(12) United States Patent
Jeong

(10) Patent No.: US 10,091,898 B2
(45) Date of Patent: Oct. 2, 2018

(54) POWER CONVERSION DEVICE

(71) Applicants: HYUNDAI MOTOR COMPANY, Seoul (KR); KIA MOTORS CORPORATION, Seoul (KR)

(72) Inventor: Sang Chan Jeong, Seoul (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 0 days.

(21) Appl. No.: 15/656,213

(22) Filed: Jul. 21, 2017

(65) Prior Publication Data
US 2018/0168056 A1  Jun. 14, 2018

(30) Foreign Application Priority Data

Dec. 13, 2016  (KR) .................. 10-2016-0169549

(51) Int. Cl.
*H05K 5/00* (2006.01)
*H05K 5/02* (2006.01)
*H05K 5/03* (2006.01)

(52) U.S. Cl.
CPC ............. *H05K 5/0247* (2013.01); *H05K 5/03* (2013.01)

(58) Field of Classification Search
CPC ............ H02G 3/08; H02G 3/081; H02G 5/00; H02G 5/06; H05K 5/00; H05K 5/02; H05K 5/03; H05K 7/00; H05K 7/02; H01R 13/46; H01R 13/53

USPC ............. 174/50, 520, 17 R, 59, 61; 439/535, 439/76.1, 76.2, 949

See application file for complete search history.

(56) References Cited

U.S. PATENT DOCUMENTS

| | | | | |
|---|---|---|---|---|
| 6,870,096 B2* | 3/2005 | Suzuki | ............... | B60R 16/0239 174/50 |
| 6,919,509 B2* | 7/2005 | Oda | ...................... | H01R 9/226 174/50 |
| 7,425,677 B2* | 9/2008 | Gates | .................. | H01R 13/508 174/50 |
| 7,465,172 B2* | 12/2008 | Ishiguro | ............... | H05K 1/0266 174/50 |
| 8,269,116 B2* | 9/2012 | Ambo | ................. | H05K 5/0069 439/76.2 |
| 8,366,457 B2* | 2/2013 | Yamamoto | ........... | H05K 3/4046 439/76.2 |

FOREIGN PATENT DOCUMENTS

KR  10-1000594 B1  12/2010

* cited by examiner

*Primary Examiner* — Angel R Estrada
(74) *Attorney, Agent, or Firm* — McDonnell Boehnen Hulbert & Berghoff LLP

(57) ABSTRACT

A power conversion device includes a housing in which a power module is mounted and a multi-phase output bus-bar. The multi-phase output bus bar has one end electrically connected to the power module and a remaining end penetrating the housing so as to be directly exposed to an outside.

5 Claims, 6 Drawing Sheets

POWER CONVERSION DEVICE

CROSS-REFERENCE TO RELATED APPLICATION

This application claims the priority benefit of Korean Patent Application No. 10-2016-0169549, filed on Dec. 13, 2016 in the Korean Intellectual Property Office, the disclosure of which is incorporated herein by reference.

BACKGROUND OF DISCLOSURE

1. Technical Field

The present disclosure relates to a power conversion device, and more particularly, to a power conversion device, which may simplify a housing by improving the structure of a connector.

2. Description of the Related Art

Recently, due to the interest in green energy, hybrid vehicles, electric vehicles and fuel-cell vehicles are attracting attention as next-generation vehicles to replace internal combustion engine vehicles.

These hybrid vehicles and electric/fuel-cell vehicles adopt an engine and a high-output motor as a power source.

The hybrid vehicles and electric/fuel-cell vehicles adopt an inverter system as a power conversion device that converts high-voltage DC power, which is generated in a battery or a fuel cell, into three-phase AC power including U-, V-, and W-phases.

A conventional inverter system includes, for example, a power module having an insulated gate bipolar transistor (IGBT), a capacitor module for absorbing ripple current caused by switching of the IGBT, and an inductor for causing a motor to be operated as a drive power generation source or filtering an output voltage. The constituent elements of the system are packaged into a housing when in use.

In the inverter system described above, a high-voltage three-phase connector of a lever-coupling type, which includes a male part and a female part for electrical connection with other constituent elements, is provided. For example, the male part of the connector is assembled in the housing in which the inverter system is packaged, and the female part of the connector, which is connected to a high-voltage wire ring, is assembled in the vehicle assembly stage. The connector female part is of the type that is assembled with the male part using a lever.

In a conventional housing structure, the connector male part, which is bolted to and assembled with the housing, is connected to the power module via an output bus-bar. The output bus-bar is bolted to and assembled with both the power module and the connector male part. In addition, a three-phase output bus-bar, which includes three bus-bars, namely U-, V-, and W-phase bus-bars, is configured to allow two of three phases to pass through a current sensor.

The present disclosure reduces the number of vehicle parts and the associated cost by integrating the connector male part with the housing. In the present disclosure, the connector male part has the same function as the three-phase output bus-bar with the exception that it is connected to the female part.

The matters disclosed in this section is merely for enhancement of understanding of the general background of the disclosure and should not be taken as an acknowledgment or any form of suggestion that the matters form the related art already known to a person skilled in the art.

SUMMARY OF THE DISCLOSURE

Therefore, the present disclosure has been made in view of the above problems, and it is an object of the present disclosure to provide a power conversion device providing a housing with a simplified structure and reduced size, through adoption of a structure that obviates a connector male part and directly exposes an output bus-bar.

In accordance with an aspect of the present disclosure, the above and other objects can be accomplished by the provision of a power conversion device including a housing in which a power module is mounted, and a multi-phase output bus-bar having one end electrically connected to the power module and a remaining end penetrating the housing so as to be directly exposed to an outside.

The housing may include a housing main body having an accommodation space with an open top side, the power module being provided in the accommodation space. The housing may further include a cover for covering the open top side of the housing main body, the multi-phase output bus-bar penetrating the cover.

The power conversion device may further include a fixture accommodated within the housing main body, the fixture serving to fix the multi-phase output bus-bar. The fixture may have an upper end configured to be press-fitted into and fixed to a lower surface of the cover.

The fixture may have a plurality of through-holes, through which the multi-phase output bus-bar passes, and a plurality of fixing protrusions, which protrudes upward from an edge of each through-hole and arranged so as to surround the output bus-bar. Each protrusion has an inner side surface for coming into contact with a side surface of the output bus-bar.

The fixing protrusions, which are arranged so as to surround the output bus-bar, may be arranged to form a predetermined gap with the output bus-bar. Each fixing protrusion may have an inclined outer side surface. The cover may be provided in the lower surface thereof with introduction recesses, into which the respective fixing protrusions are introduced and fixed. The fixing protrusions may be elastically brought into close contact with the output bus-bar while being introduced into the introduction recesses.

The fixture may be formed of a plastic material.

The power conversion device may further include a current sensor accommodated within the housing main body and installed to allow the multi-phase output bus-bar to penetrate therethrough so that the current sensor is electrically connected to a selected output bus-bar of the multi-phase output bus-bar. The fixture may be seated on an upper surface of the current sensor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
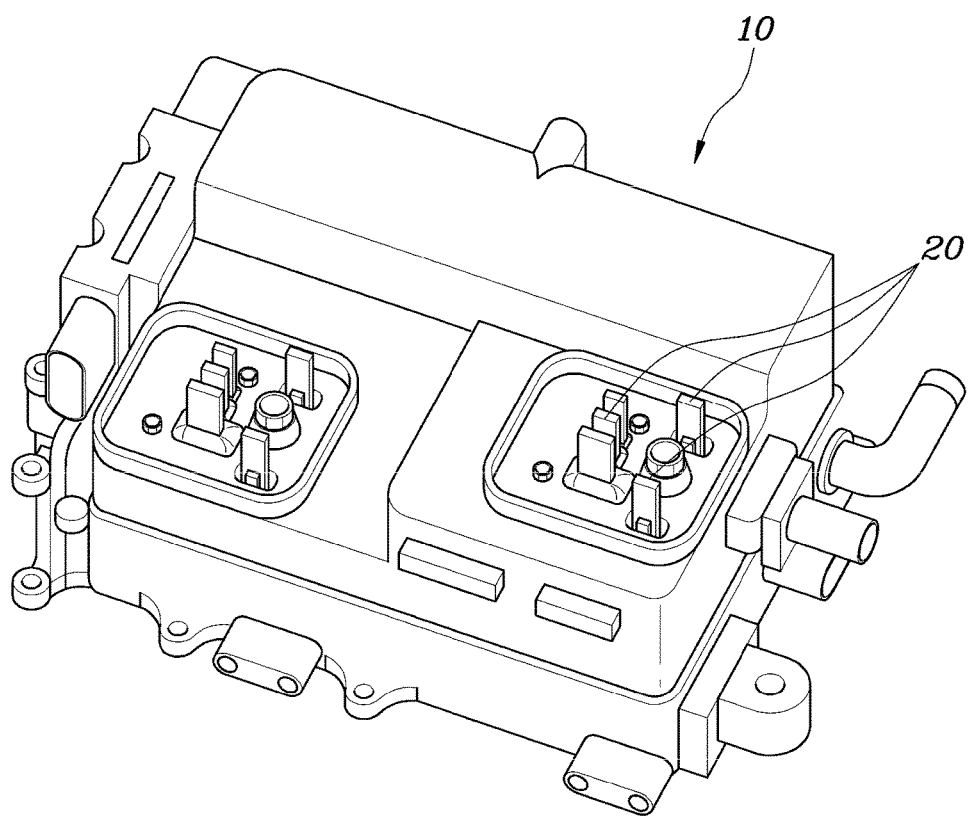
FIG. 1 is a perspective view illustrating a power conversion device according to an embodiment of the present disclosure.

Hereinafter, the embodiments of the present disclosure will be described in more detail with reference to the accompanying drawings. However, the present disclosure is not limited to the embodiments described below, and may be implemented in various different forms. The embodiments herein are merely provided to complete the disclosure of the preset disclosure and to completely instruct the scope of the present disclosure to those skilled in the art. Throughout the drawings, the same reference numerals designate the same elements.

As illustrated in the drawings, the power conversion device according to the embodiment of the present disclosure includes a housing 10 in which a power module 1 is mounted, and a multi-phase output bus-bar 20, which has one end electrically connected to the power module 1 and the other end penetrating the housing 10 so as to be directly exposed to the outside. In addition, the power conversion device further includes a fixture 30, which is accommodated in a housing main body 11 and serves to fix the multi-phase output bus-bar 20, and a current sensor 40, which is accommodated in the housing main body 11. The current sensor 40 is installed to allow the multi-phase output bus-bar 20 to penetrate therethrough so that the current sensor 40 is electrically connected to a selected output bus-bar 20 of the multi-phase output bus-bar 20.

One embodiment of the present disclosure adopts a three-phase output bus-bar (hereinafter collectively referred to as "output bus-bar"), which includes three U-, V-, and W-phase bus-bars.

In the housing 10, the power module 1, the output bus-bar 20, the fixture 30, and the current sensor 40 are mounted. Thus, the housing 10 defines therein an accommodation space in which the aforementioned elements are mounted. Of course, the elements in the accommodation space of the housing 10 are not limited to the aforementioned elements, and various other elements, such as a capacitor module and an inductor, may also be mounted therewith.

The housing 10 includes the housing main body 11 having the accommodation space with the open top side and a cover 13 for covering the open top side of the housing main body 11.

At this time, the end of the output bus-bar 20 penetrates the cover 13 to thereby be directly exposed to the outside of the housing 10.

The fixture 30 serves to fix the position of the output bus-bar 20 and to allow the output bus-bar 20 to be spaced apart from the housing main body 11 and the cover 13 by a predetermined distance for insulation therebetween.

Of course, an insulator may be interposed between the output bus-bar 20, the housing main body 11, and the cover 13.

The entire fixture 30 is manufactured into a planar shape, and is configured to fix the position of the output bus-bar 20 penetrating therethrough. In the fixture 30, through-holes 31, through which the output bus-bars 20 penetrate, are formed in the same number as the number of output bus-bars 20. As seen in the figures, the fixture 30 may be provided with three through-holes 31 to accommodate three-phase output bus-bar 20.

Meanwhile, the fixture 30 is also provided with a plurality of fixing protrusions 33. Each protrusion protrudes upwardly from the edge of the through-hole 31 so as to surround the output bus-bar 20 in order to fix the output bus-bar 20.

The fixing protrusions 33, which surround the output bus-bar 20, are arranged to form a predetermined gap D2 with the output bus-bar 20. In addition, when the fixture 30 and the cover 13 are assembled with each other, the inner side surface of each fixing protrusion 33 is brought into contact with and is fixed to the side surface of the output bus-bar 20.

In order to allow the fixing protrusion 33 to elastically come into close contact with the output bus-bar upon assembly, the outer side surface of the fixing protrusion 33 may be inclined. At this time, the outer side surface 33a may have a straight shape so as to have a constant slope, or may have a curved shape having a constant curvature. In one embodiment of the present disclosure, the outer side surface of the fixing protrusion 33 has a curved shape.

The cover 13 has introduction recesses 13a formed in the lower surface thereof so that the fixing protrusions 33 are introduced into and fixed to the respective introduction recesses 13a. As such, the upper end of the fixture 30, i.e. the fixing protrusions 33, are press-fitted into and fixed to the introduction recesses 13a, which are formed in the lower surface of the cover 13.

As each fixing protrusion 33 is introduced into the introduction recess 13a in the cover 13, the fixing protrusion 33 is elastically brought into close contact with the output bus-bar 20 by the slope of the outer side surface thereof. To this end, the fixing protrusions 33 may be formed in opposing pairs around the output bus-bar 20.

Meanwhile, the fixing protrusions 33 are deformed in shape so as to come into close contact with the output bus-bar 20 upon assembly. The fixture 30, provided with the fixing protrusions 33, may be manufactured using a highly elastic plastic material. For example, the fixture may be formed via injection molding using a plastic material.

The process of assembling the power conversion device according to the embodiment of the present disclosure having the above-described configuration will be described below with reference to the accompanying drawings.

Figure 2:
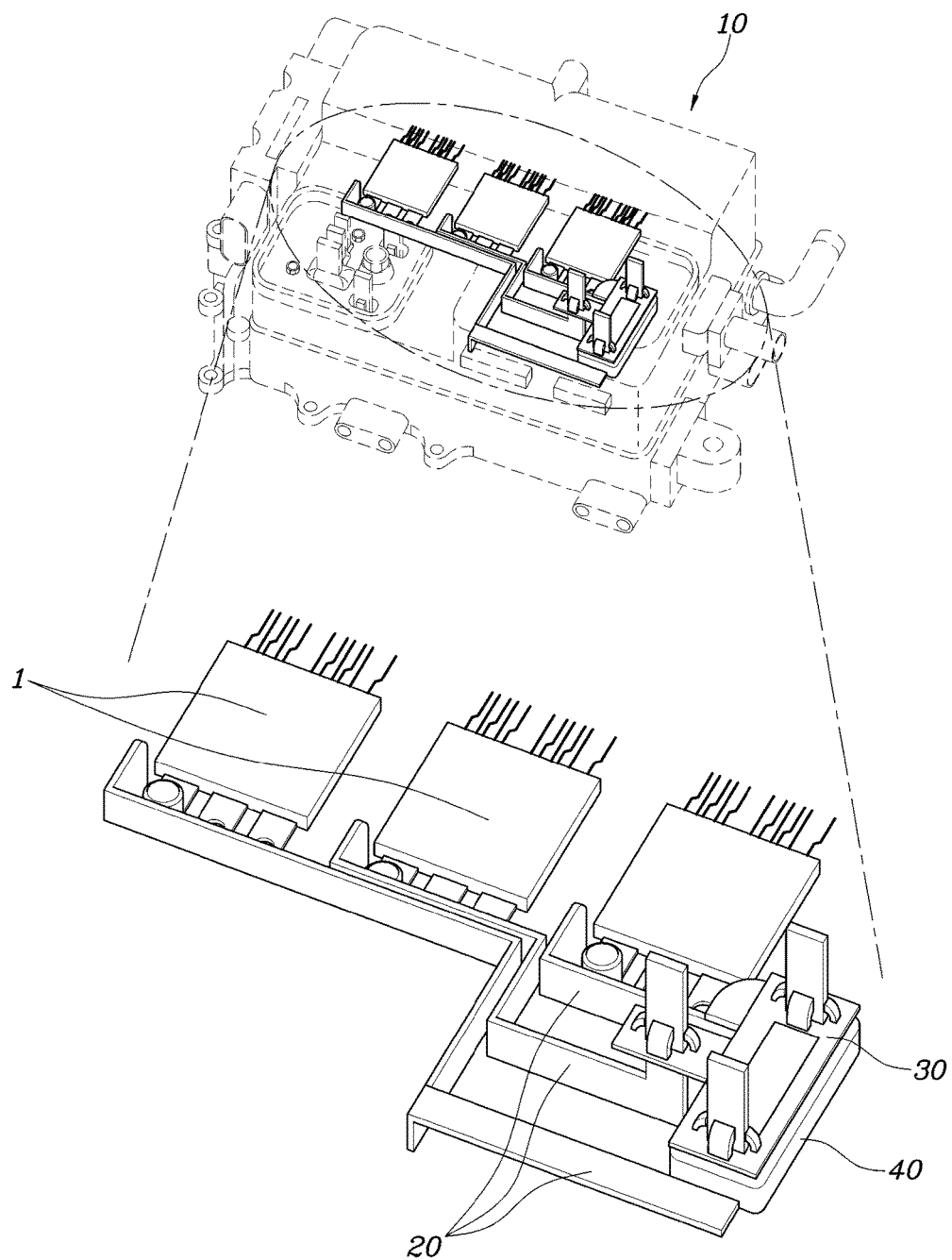
FIG. 2 is an enlarged perspective view illustrating major parts of the power conversion device according to an embodiment of the present disclosure.

First, as illustrated in FIG. 2, the power module 1 and the output bus-bar 20 electrically connected thereto are installed inside the housing main body 11. At this time, the output bus-bar 20 is arranged in such a manner that one end of the output bus-bar 20 passes through the open top side of the housing main body 11 to thereby be exposed to the outside of the housing main body 11.

Then, the current sensor 40 is connected to the end of the output bus-bar 20, and the fixture 30 is seated on the upper surface of the current sensor 40 so as to fix the position of the output bus-bar 20.

Figure 5:
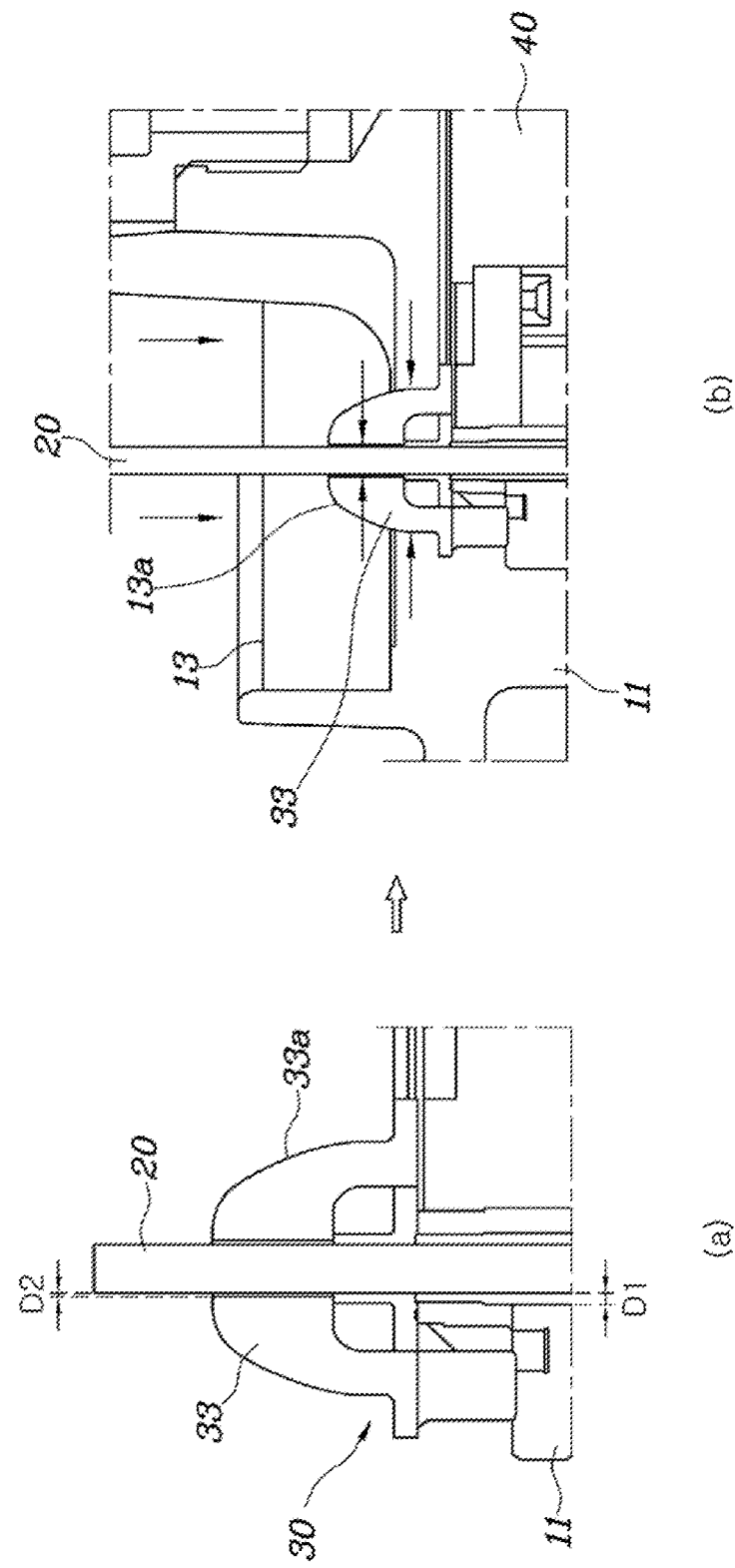
FIG. 5 is a view illustrating the process of assembling the power conversion device according to an embodiment of the present disclosure.
Figure 6:
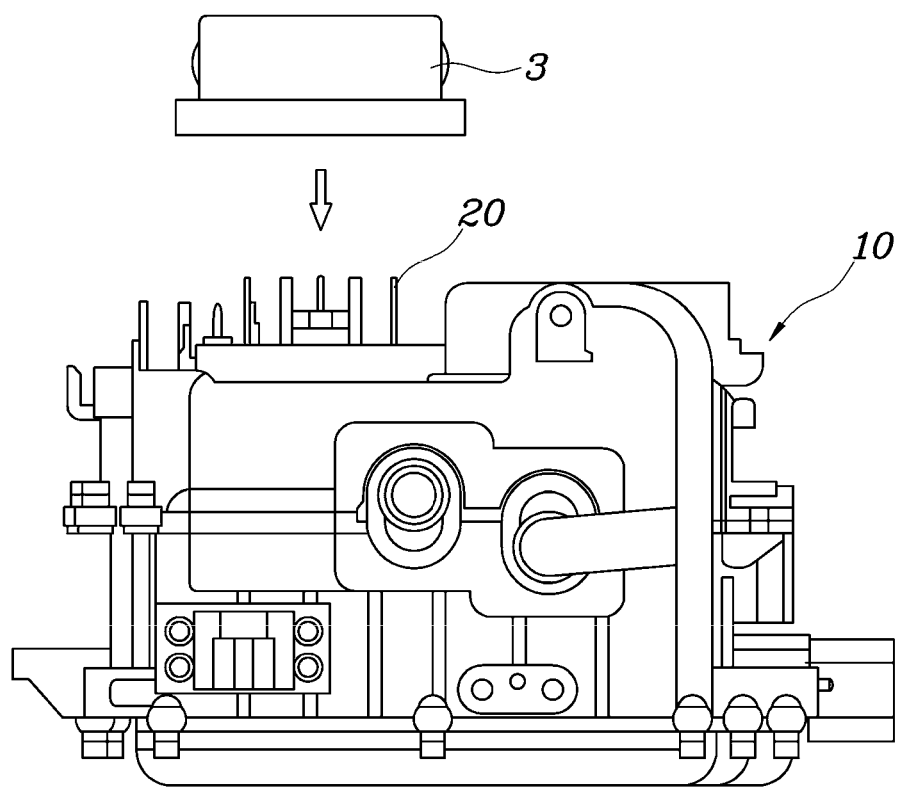
FIG. 6 is a view illustrating the connection relationship of another connector and the power conversion device according to an embodiment of the present disclosure.

The state in which the output bus-bar 20 has been fixed is illustrated in FIG. 5(a). At this time, the output bus-bar 20 and the fixing protrusions 33 of the fixture 30 remain spaced apart from each other by a predetermined gap D2. The predetermined distance between the output bus-bar 20 and the fixing protrusions 33 of the fixture 30 may ensure easy assembly of the fixture 30, and may prevent any damage, such as scratches, on the side surface of the output bus-bar 20.

As illustrated in FIG. 5(b), the open top side of the housing main body 11 is covered with the cover 13. Thereby, the cover 13 is assembled along the inclined outer side surfaces of the fixing protrusions 33, causing the fixing protrusions 33 to come into close contact with the output bus-bar 20. As a result, the orientation and position of the output bus-bar 20 is fixed. At this time, the end of the output bus-bar 20 penetrates the cover 13 to thereby be exposed to the outside.

Figure 3:
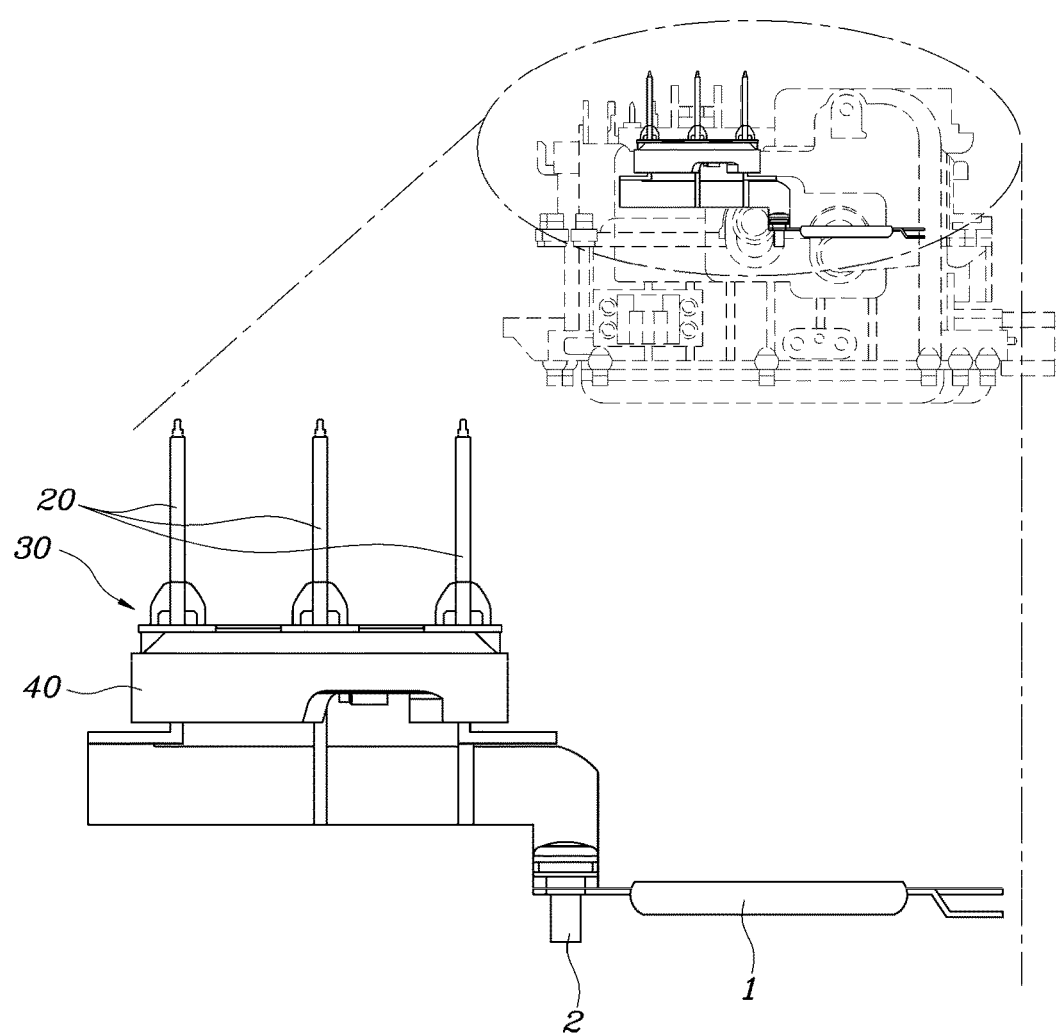
FIG. 3 is an enlarged side view illustrating major parts of the power conversion device according to an embodiment of the present disclosure.
Figure 4:
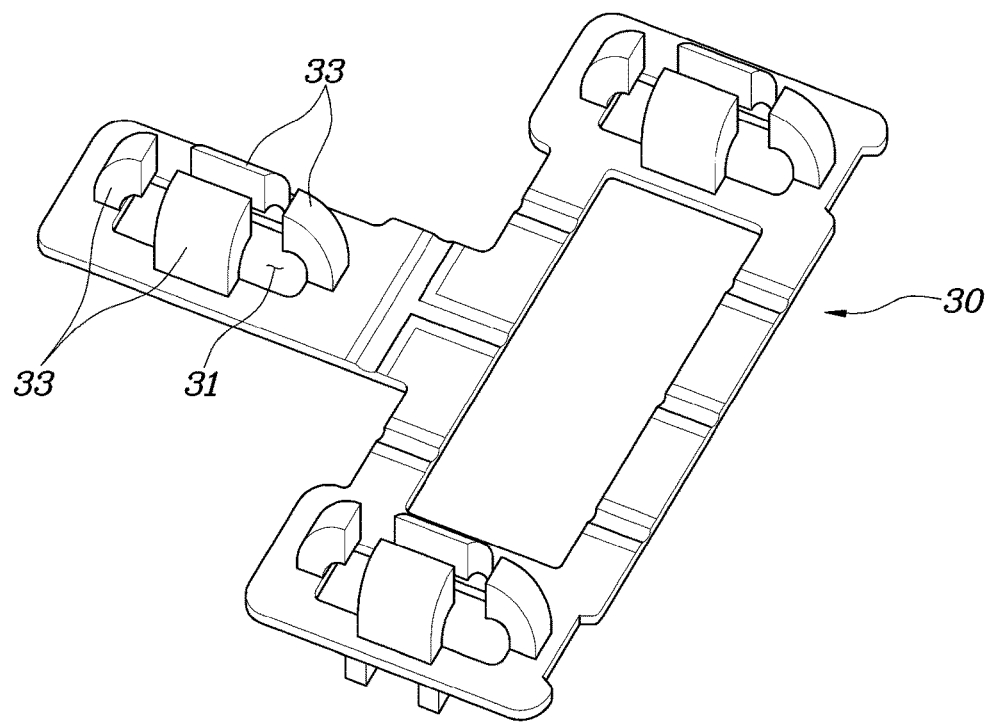
FIG. 4 is a perspective view illustrating a fixture according to an embodiment of the present disclosure.

As illustrated in FIG. 3, once the end of the output bus-bar 20 has been fixed while being directly exposed to the outside of the cover 13, a connector 2 having a female part structure may be directly connected to the exposed output bus-bar 20.

Accordingly, the present disclosure simplifies the structure of the housing 10 and reduces the size of the housing 10, due to the elimination of a connector having a male part structure from the housing 10.

In addition, the effect of firmly fixing the output bus-bar 20 may be achieved by assembling the cover 13 with the housing main body 11 in which the fixture 30 is provided.

As is apparent from the above description, according to the embodiment of the present disclosure, the housing may achieve a simplified structure and a reduced size due to removing a connector male part by directly exposing an output bus-bar, which is electrically connected to a power module, to the outside of a housing.

Thus, the cost of a connector male part and the cost of a fastening bolt may be saved.

In addition, as a result of replacing a connector male part, which has been used to fix the position of the output bus-bar, with a fixture that is a plastic injection-molded article, the output bus-bar may be assembled in a simplified manner and may be fixed by being assembled with a cover, which constitutes the housing. This advantageously eliminates fastening via a separate bolt.

In addition, the fixture may ensure a sufficient insulation distance between the output bus-bar, a housing main body, and the cover.

Although the preferred embodiments of the present disclosure have been described above with reference to the accompanying drawings, those skilled in the art will appreciate that the present disclosure can be implemented in various other embodiments without changing the technical ideas or features thereof.

What is claimed is:

1. A power conversion device comprising:
a housing in which a power module is mounted;
a multi-phase output bus-bar having one end electrically connected to the power module and a remaining end penetrating the housing so as to be directly exposed to an outside; and a fixture,
the housing further including: a housing main body having an accommodation space with an open top side, the power module being provided in the accommodation space; and a cover for covering the open top side of the housing main body, the multi-phase output bus-bar penetrating the cover,
wherein the fixture is accommodated within the housing main body, the fixture serving to fix the multi-phase output bus-bar,
the fixture further having an upper end configured to be press-fitted into and fixed to a lower surface of the cover.

2. The power conversion device according to claim 1, wherein the fixture has a plurality of through-holes, through which the multi-phase output bus-bar passes, and
wherein the fixture further has a plurality of fixing protrusions, which protrudes upwardly from an edge of each through-hole and arranged so as to surround the output bus-bar, each protrusion having an inner side surface for coming into contact with a side surface of the output bus-bar.

3. The power conversion device according to claim 2, wherein the fixing protrusions, which are arranged so as to surround the output bus-bar, are arranged to form a predetermined gap with the output bus-bar,
wherein each fixing protrusion has an inclined outer side surface,
wherein the cover is provided in the lower surface thereof with introduction recesses, into which the respective fixing protrusions are introduced and fixed, and
wherein the fixing protrusions are elastically brought into contact with the output bus-bar while being introduced into the introduction recesses.

4. The power conversion device according to claim 3, wherein the fixture is formed of a plastic material.

5. The power conversion device according to claim 1, further comprising a current sensor accommodated within the housing main body and installed to allow the multi-phase output bus-bar to penetrate therethrough so that the current sensor is electrically connected to a selected output bus-bar of the multi-phase output bus-bar,
wherein the fixture is seated on an upper surface of the current sensor.

* * * * *